US005996728A

United States Patent [19]

Stark

[11] Patent Number: 5,996,728

[45] Date of Patent: Dec. 7, 1999

[54] MODULAR SPEAKER CABINET INCLUDING AN INTEGRAL RIGGING SYSTEM

[75] Inventor: James M. Stark, Auburn, Mass.

[73] Assignee: Eastern Acoustic Works, Inc., Whitinsville, Mass.

[21] Appl. No.: 09/291,165

[22] Filed: Apr. 13, 1999

[51] Int. Cl.[6] .......... H05K 5/00

[52] U.S. Cl. .......... 181/144; 181/199; 248/282.1; 248/323

[58] Field of Search .......... 181/144, 145, 181/148, 199; 381/386, 390; 248/282.1, 323

[56] References Cited

U.S. PATENT DOCUMENTS

| | | | |
|---|---|---|---|
| 1,866,831 | 7/1932 | Wolff et al. . | |
| 4,014,597 | 3/1977 | Griffin, Jr. . | |
| 4,042,778 | 8/1977 | Clinton . | |
| 4,054,750 | 10/1977 | Montgomery et al. . | |
| 4,107,461 | 8/1978 | Bose . | |
| 4,179,585 | 12/1979 | Herrenschmidt . | |
| 4,227,047 | 10/1980 | Horne . | |
| 4,270,023 | 5/1981 | Beveridge . | |
| 4,660,728 | 4/1987 | Martin . | |
| 4,701,951 | 10/1987 | Kash . | |
| 4,730,693 | 3/1988 | Kobus . | |
| 4,805,730 | 2/1989 | O'Neill et al. | 181/148 |
| 4,844,565 | 7/1989 | Brafford et al. . | |
| 4,882,760 | 11/1989 | Yee . | |
| 4,884,655 | 12/1989 | Freadman et al. . | |
| 5,000,286 | 3/1991 | Crawford et al. . | |
| 5,258,584 | 11/1993 | Hubbard . | |
| 5,266,751 | 11/1993 | Taguchi . | |
| 5,309,518 | 5/1994 | Ickler et al. . | |
| 5,402,502 | 3/1995 | Boothroyd et al. . | |
| 5,584,595 | 12/1996 | Gantitano et al. . | |
| 5,602,366 | 2/1997 | Whelan et al. . | |
| 5,714,723 | 2/1998 | Kang . | |
| 5,758,852 | 6/1998 | Martin . | |

*Primary Examiner*—Khanh Dang

*Attorney, Agent, or Firm*—Fulwider Patton Lee & Utecht, LLP

[57] ABSTRACT

A speaker rigging system that features a modular speaker cabinet that incorporates an internal load bearing frame and an internal speaker to speaker coupling mechanism. Speaker to speaker coupling is accomplished by means of a plurality of small, easy to handle coupling pins that allow for the creation of vertical speaker arrays with a minimal gap between speakers in the array.

13 Claims, 6 Drawing Sheets

MODULAR SPEAKER CABINET INCLUDING AN INTEGRAL RIGGING SYSTEM

BACKGROUND OF THE INVENTION

1. Field of the Invention

The present invention relates to the field of speaker rigging systems and more particularly to a system to be used for large venue touring.

2. Description of the Prior Art

A large venue touring sound system comprises a number of high output loudspeakers and a method of rigging the speakers into suspended vertical columns known as "sound columns" or vertical arrays. In a typical venue, multiple arrays of speakers are required to achieve adequate sound coverage, intensity, and quality.

Large venue touring sound systems are typically used by "rock and roll" bands on nationwide and worldwide tours. On a typical nationwide tour a band will play in twenty or thirty cities. The number of nights a concert is performed varies and may be as few as one night in smaller cities and is typically fewer than five nights even in large cities. Venues where concerts take place also vary from large outdoor stadiums capable of holding 80,000 or more people to smaller indoor arenas which may seat as few as 15,000 people.

Thus, a touring sound system must be capable of being quickly assembled and suspended in vertical arrays prior to a performance. Of equal importance is the ability to quickly disassemble the sound system, load it onto trucks, and transport it to the next venue subsequent to the performance. In addition, a touring sound system must possess a high degree of flexibility as the requirements in terms of the number of arrays required and the complexity of the rigging hardware may vary considerably between an outdoor stadium and a comparatively smaller indoor arena.

From a practical standpoint, factors that must be considered in setting up a sound stage include the number of speakers required; the corresponding complexity of the suspension apparatus; the number of man-hours required to set up and tear down the system; as well as the truck space required to transport the system. Safety is also a significant concern as high capacity loudspeakers are of substantial weight and the complexity of the rigging system creates significant potential for accidents.

Acoustical factors are also important to the success of a large venue touring sound system. Acoustics engineers have learned that superior music reproduction occurs when a series of speakers are arranged in a spaced vertical relationship to form a "sound column" or vertical array. Experience has shown that vertical arrays increase sound intensity in the horizontal plane of an audience and lose substantially less sound intensity through vertical dispersion than other speaker arrangements. Recent research has shown that the performance of vertical arrays can be further improved by carefully controlling gap size and minimizing gaps between high frequency elements. Ultimately, the success of a large venue touring sound system depends to a large extent on its ability to adequately address each of the practical and acoustical concerns in a cost effective manner.

The traditional approach to rigging a sound system for a large venue involves the construction of an elaborate multilevel space frame. In large stadiums such frames are often two or three stories high and in excess of 100 feet in width. Vertical arrays are constructed by suspending speakers in long columns from the frame. The suspension apparatus typically consists of chains or cables to which the speakers are attached. Various means of connecting the speakers to the chains or cables are in widespread use. These include belt and buckle type fittings, clevis and shackle arrangements, as well as claw type devices where a claw interfaces with a fixed stud, ring, or hook mounted on the speaker case. The prior art methods have long been plagued by numerous drawbacks. Vertical arrays suspended from either chains or cables are flexible and tend to sway in even a light breeze. Thus, the speakers must be spaced sufficiently apart horizontally to account for this motion. In addition, the space frame supporting the vertical array must be designed to provide stability to the swaying columns and is therefore more elaborate and heavier than would otherwise be required. Further, the means of attaching the speakers to the chains or cables, whether of the belt and buckle type, clevis and shackle type, or of the claw type, are inherently slow and therefore substantial man-hours are required to assemble and suspend multiple arrays. The prior art methods typically require the installer to use both hands to couple the speaker to the chain or cable which can be a serious safety concern given the weight of the speakers and the height at which they are commonly suspended. The prior art methods also require the transport of large quantities of bulky hardware in addition to the speakers themselves. Such hardware consumes substantial truck space and is relatively heavy and therefore incurs significant transportation costs. Finally, none of the prior art methods are able to maintain the close vertical spacing between speaker cabinets that recent acoustics research indicates is desirable to increase the efficiency of a vertical array.

An example of the chain style of suspension is U.S. Pat. No. 4,660,728, entitled "Flying Sound Systems", issued to Martin, Apr. 28, 1987. Martin discloses a method of attaching speakers to a pair of suspended chains. Martin places a coupling device on the sides of the speaker cabinets that interfaces with a mating device which can be attached to hanging chains. The back panels of the speakers are connected by straps in an effort to provide some degree of stability to the chain suspended speaker array. Although the coupling device taught in Martin demonstrates creativity in design, it is complex and not demonstrably faster than a conventional shackle and ring arrangement. Further, the straps Martin places on the backs of the speaker cabinets are themselves flexible and thus do not significantly increase the rigidity of the speaker column. Nor can the system disclosed in Martin maintain close vertical spacing between speaker cabinets.

An example of a space frame approach is shown in U.S. Pat. No. 5,602,366, entitled "Space Frame With Array Element Positioning" issued to Whelan et al, Feb. 11, 1997. This patent discloses a variation of the traditional space frame used to stack a vertical column of speakers. Although effective, the patent demonstrates the complexity of connections and the bulk of structure associated with even a relatively small space frame.

What is needed therefore is a modular rigging system expressly designed for the creation of "sound columns" for use in large venues. Ideally, the system should be able to create a rigid vertical "sound column" and should possess the capability to quickly couple and just as quickly uncouple the vertical array of speakers. Further, the system should require a minimum of hardware. Ideally the means for vertical suspension would be contained within the speaker cabinet itself, thereby eliminating the need for chains or cables and their associated rigging hardware. In addition, the mechanism used to couple the individual loudspeakers should be designed to provide for a minimal gap between each loudspeaker in the vertical array.

SUMMARY OF THE INVENTION

The rigging system of the present invention comprises a modular loudspeaker cabinet which includes a plurality of internal speaker to speaker keyhole lock-plate coupling mechanisms and an internal load carrying frame structure. The speaker cabinet's internal structure includes upper and lower frames which are connected by means of vertical tie rods. The tie rods create a vertical load path for the transmission of tensile loads between the frames. Each frame includes box section slide tracks in which sliding keyhole lock-plate assemblies are located. Further, each frame includes a ball lock pin type actuator capable of slidably moving the lock-plates from a locked to a released position. The cabinet assembly's exterior panels are mechanically fastened to the upper and lower frames. The modular speakers are coupled to form a vertical column by means of steel coupling pins. Each coupling pin includes an annular groove at each end. The annular groove may be slidably engaged and released by a keyhole lock-plate.

The rigging system of the present invention possesses several advantages over the prior art. The present invention creates a rigid vertical array of speakers with a plurality of small coupling pins. All load carrying structure is located internally within the speaker cabinet; thus, the cables and chains, shackles and rings, hooks and fittings, and other rigging hardware of the prior art are completely eliminated. As such, the volume of hardware that must be transported from venue to venue is dramatically reduced. In addition, the internal coupling mechanism allows for quick and simple coupling of speakers and is also designed for one handed operation. Quick and simple coupling decreases array setup costs and one handed operation increases operator safety as well as increasing the speed and ease with which "sound columns" can be created. Further, due to the short length of the coupling pins, small gaps on the order of one half inch can be maintained between speakers in a vertical array.

It is to be emphasized, that there are no known speaker rigging systems disclosed in the prior art, in which the speaker cabinet possesses either an internal load carrying frame or an internal speaker to speaker coupling device. Other features and advantages of the invention will become apparent from the following detailed description.

BRIEF DESCRIPTION OF THE DRAWINGS

For a better understanding of the invention and the features thereof, reference is made to the following description which is to be read in conjunction with the accompanying drawings wherein:

FIG. 6(*b*) is a vertical sectional view, enlarged in scale, similar to 6(*a*), depicting the actuator with the locking balls depressed;

FIG. 6(*c*) is a vertical sectional view, enlarged in scale, similar to 6(*a*), depicting the actuator in the open or coupling pin unlocked position;

DETAILED DESCRIPTION OF THE PREFERRED EMBODIMENT

Figure 1:
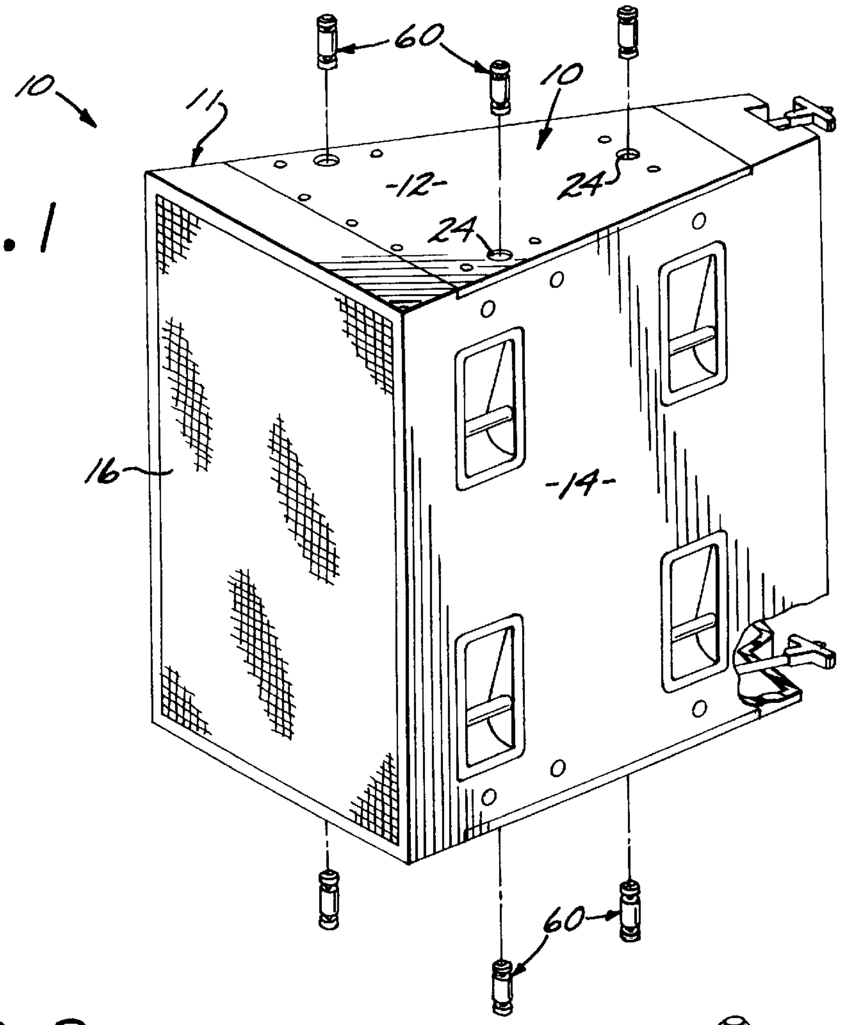
FIG. 1 is a side perspective view of a speaker cabinet embodying the present invention.
Figure 2:
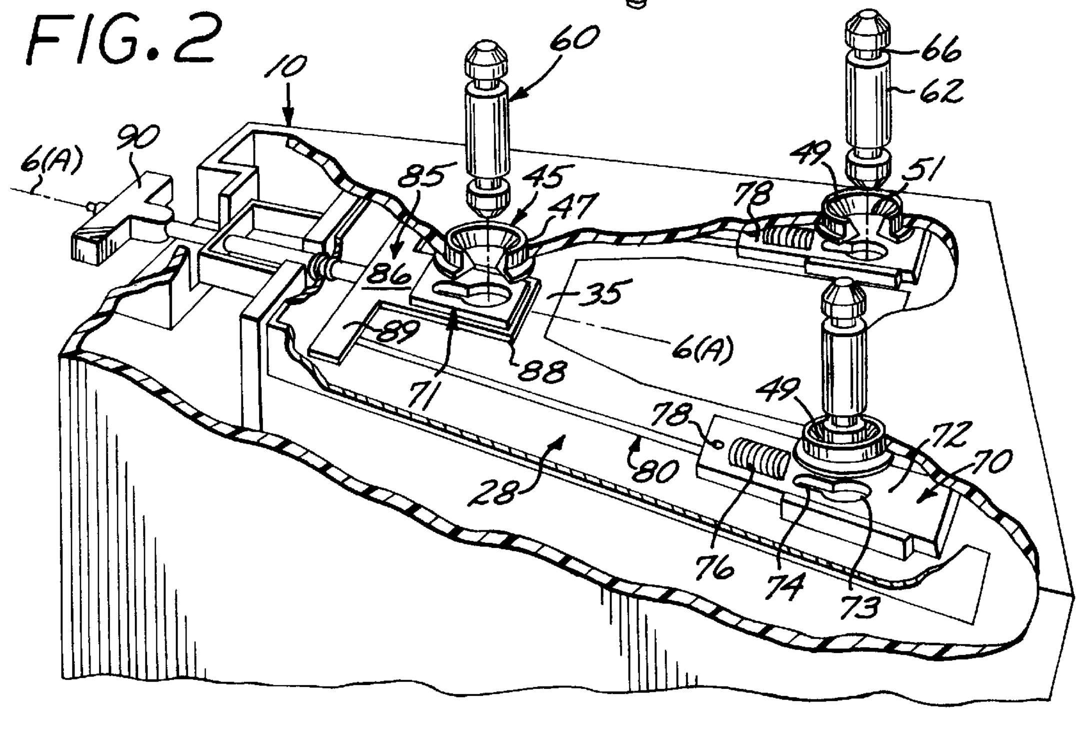
FIG. 2 is a cutaway perspective view of the top portion of the speaker cabinet shown in FIG. 1, enlarged in scale, and rotated 180 degrees, showing the upper frame and lock-plate assemblies.
Figure 3:
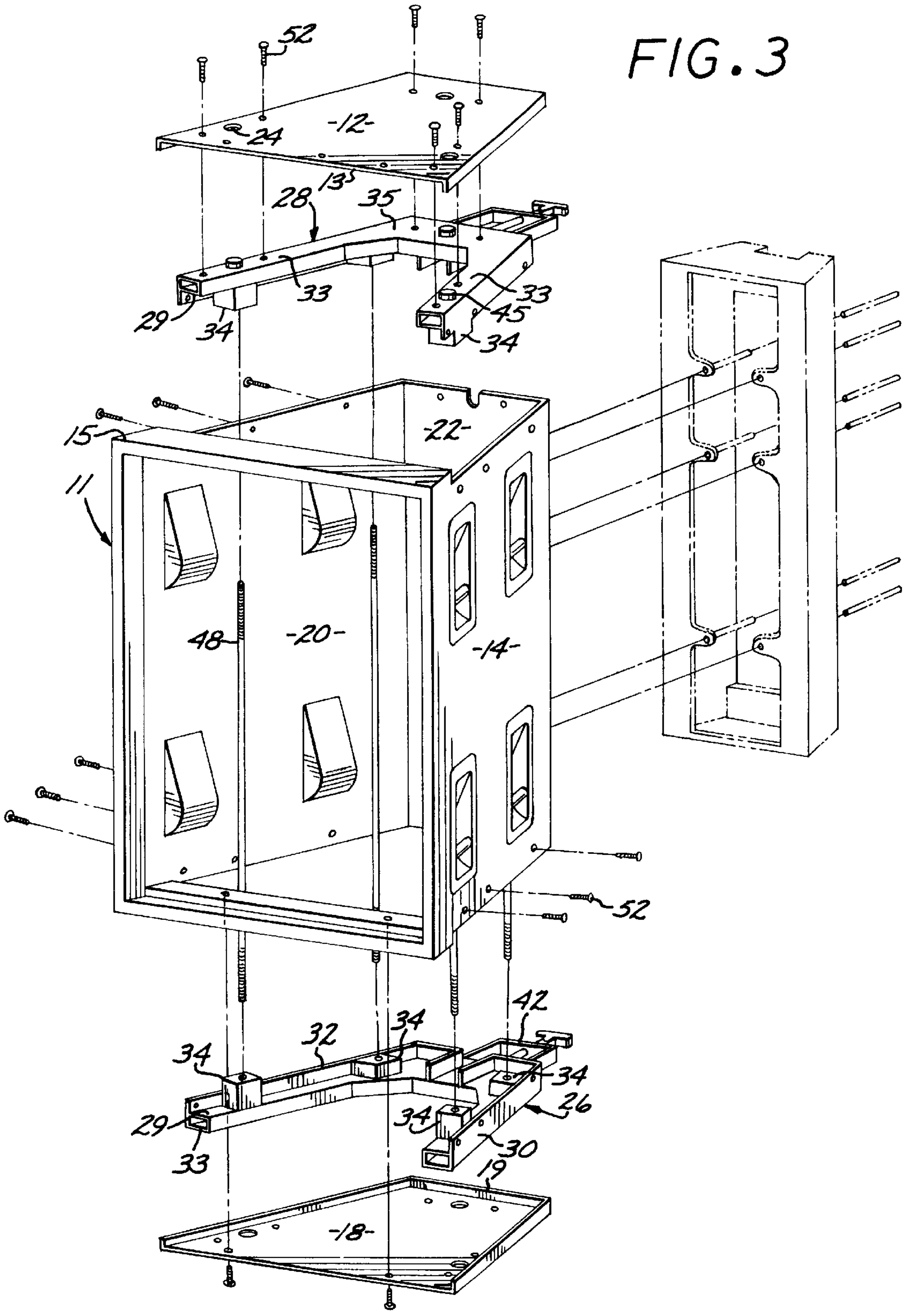
FIG. 3 is a rear perspective exploded view, reduced in scale, of the speaker cabinet of FIG. 1, with the front panel removed to depict interior details.

Referring to FIGS. 1, 2, and 3, the rigging system of the present invention comprises a modular speaker cabinet assembly, generally designated 10, which includes an upper frame, generally designated 28, and a lower frame, generally designated 26. The frames face each other in vertical alignment and are connected in a spaced vertical relationship by a plurality of vertical tie rods 48. Configured within each frame and slidably movable along a predetermined slide path are a plurality of sliding keyway or keyhole lock-plate assemblies 70, and an assembly 71. Integrally carried within each frame is a ball lock pin type actuator 90, which is connected to the lock-plate assemblies 70 within a respective frame by means of a plurality of connecting rods, generally designated 80, and is further connected to the lock-plate assembly 71 by means of a bracket, generally designated 85. The actuator is capable of slidably shifting the lock-plates between a locked and a released position. The modular speaker cabinets are connected in a vertical spaced relationship by means of a plurality of coupling pins 60 which are releasably engageable by means of the lock-plate assemblies.

Referring to FIGS. 1 and 3, the speaker cabinet assembly 10 also includes a cabinet formed by a top panel 12, a bottom panel 18, a front grill 16, and a housing 11. The housing includes a pair of side walls 14 and 20, a back panel 22, and a front frame 15, and is formed as an integral one piece unit. The top and bottom panels are of flat, bilaterally symmetrical trapezoidal configuration and are formed with a plurality of bores 24 arranged in a predetermined pattern through which the coupling pins 60 may be inserted. The panels are mirror images of each other and are identical in all respects. The front, back, and side panels, and front frame which comprise the housing are of substantially flat rectangular configuration. The front frame 15 includes a stepped rectangular recess 17 for nesting with the front grill. The front grill is readily removable to provide easy access to the interior of the speaker cabinet for installation of speakers and other electronic hardware. The housing and the top and bottom panels are attached to the upper and lower frames by means of a plurality of screws 52.

Figures 4, 5:
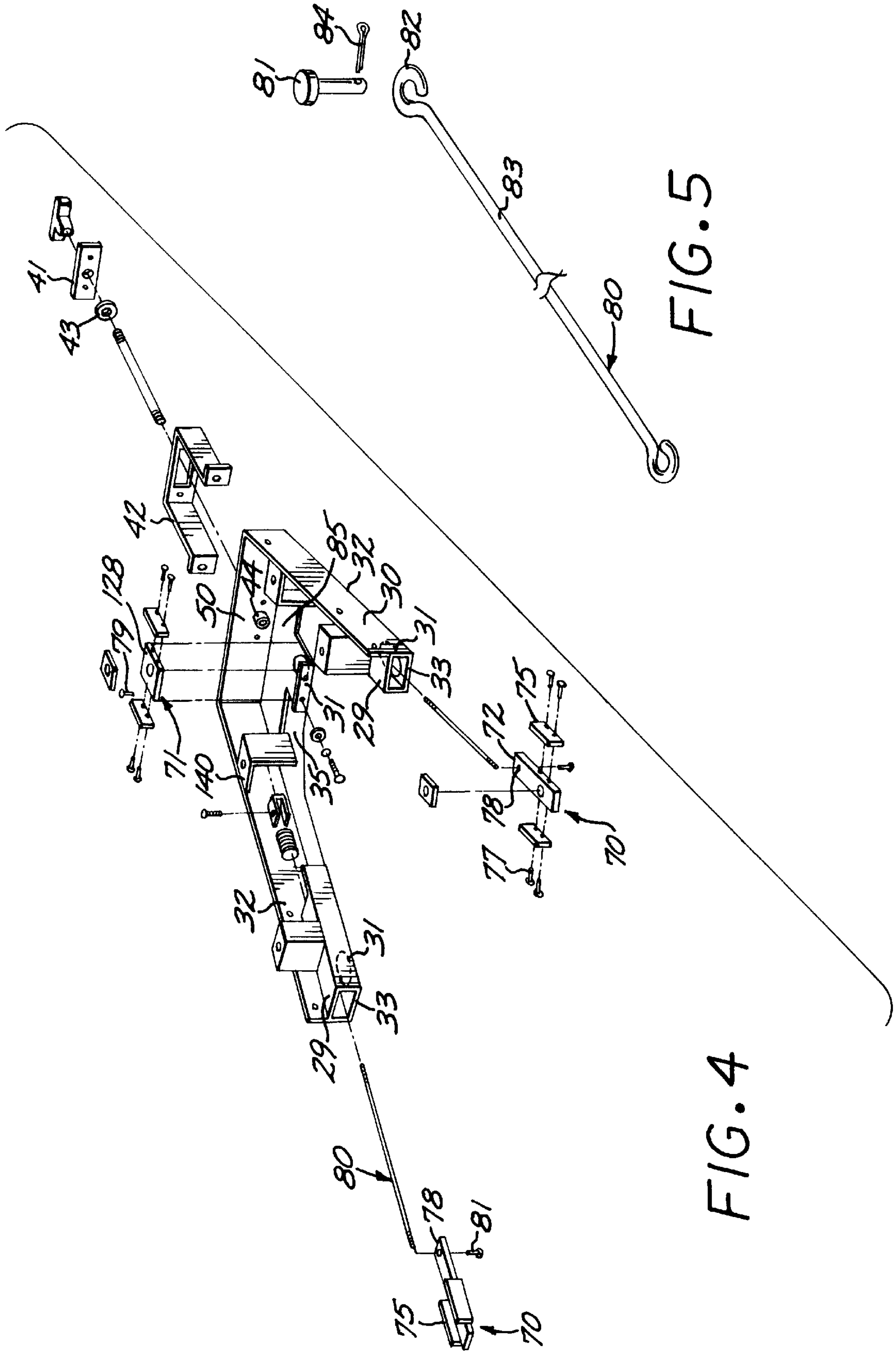
FIG. 4 is an exploded perspective view, enlarged in scale, of the lower frame assembly of FIG. 2.
FIG. 5 is a perspective view of the connecting rod in enlarged scale, shown in FIG. 4.

Referring to FIGS. 3 and 4, the upper and lower frames 26 and 28 are also mirror images of each other and are identical in all respects. The frames are generally A-shaped in configuration with the upper end of the A being somewhat truncated. The frames are constructed from a series of conventional metal weldments. Each frame includes a pair of legs 30 and 32 which are generally formed with a rectangular box shaped cross section which defines a longitudinal slide track for internal receipt of the lock-plate assemblies 70. The depth of the box section is sized such that an inward facing surface 29 will function as a pin stop, thereby spacing the coupling pins 60 such that they will properly engage the lock-plates. Disposed on the upper face 33 of each leg is a bore 31. A third bore 31 is located on a flange 35 which forms the upper portion of the truncated A-shape. The bores 31 are located in the center of a slide path defined by the limits of travel of the lock plates between their respective locked and release positions. Each bore 31 is located so as to register in vertical alignment with the bores 24 in the top and bottom panels 12 and 18 respectively and is further registerable with pin receiving keyhole openings in the lock-plate assemblies. In addition, each frame includes a plurality of rod supports 34 which are formed as cube shaped weldments each of which includes a floating nut plate 140 into which the tie rods 48 are threaded. Also included with each frame are a pair of cylindrical actuator support bushings 43 and 44. The actuator support bushings are attached to each respective frame in spaced axial alignment for receipt of the actuator 90 in slip fit relationship. The actuator support bushing 44 is welded to an angle weldment 50 which forms the uppermost vertical flange of the truncated top of the A-shaped frame. The actuator support bushing 43 is welded to a support plate 41 which is attached to a bracket 42 by mechanical fasteners. The bracket 42 is further attached to the weldment 50 by mechanical fasteners.

The tie rods or vertical members 48 which rigidly connect the upper and lower frames are solid steel rods which are formed with an external thread at each end. The threaded ends allow the tie rods to be attached to the frames by means of the floating nut-plates 140 included in the rod support posts 34. The tie rods in conjunction with the frames form the primary load carrying structure of the speaker cabinet assembly.

Referring to FIG. 2, a steel support collar 45 aligns and locates each speaker coupling pin 60. Each support collar is registered with a bore 31 on the upper and lower frames respectively and subsequently welded to the respective frame. Each collar includes a circular bore 51, of a diameter to accept a coupling pin 60 in slip fit relationship. The support collars are formed with necks 47 which extend upward through the bores 24 in either the top or bottom panels 12 and 18 attached to the respective upper or lower frames. The necks 47 end flush with the exterior surface of the respective panels. The collars also contain a radial chamfer 49 on the inside diameter of the collar which serves to guide the speaker to speaker coupling pins into the collars.

Referring to FIGS. 2 and 4, a plurality of lock-plate assemblies 70 and 71 slidably engage and securely lock in place the speaker to speaker coupling pins 60. The lock-plate assemblies 70 are slidably carried in the longitudinal tracks defined by the box section of each frame leg. Each lock-plate assembly possesses a keyhole plate 72. The keyhole plate possesses a keyhole pattern consisting of a major diameter opening 73 tapering to a minor diameter opening 74. The lock plate is slidable such that both the major and the minor diameter opening may be registered in vertical alignment with the bore 51 of the support collar 45. The major diameter opening is slightly larger than, and in slip fit relationship with, the outside diameter 62 of the coupling pin 60. The minor diameter 74 is smaller than the major diameter 73 and includes a latching edge which is designed to interface with an annular groove 66 in the coupling pin 60. The lock-plate 72 further includes a rectangular cutout for a biasing spring 76. The biasing spring 76 biases the lock-plates 72 firmly into the locked position when the actuator 90 is in the engaged position and thereby compensates for "play" created by tolerance stackup in the actuator 90 to lock-plate 72 linkage, formed by the cross bracket 85 and connecting rods 80. Attached to each long rectangular side of the lock-plate 72, by means of screws 77, is a guide bearing 75 composed of High Molecular Weight plastic. The guide bearings allow the lock-plates to travel freely within the box section slide tracks of the frames 26 and 28. Each lock-plate also includes a hole 78 for connection to the connecting rods 80.

The lock-plate assembly 71, which includes a lock-plate 128, is essentially similar to the lock-plate assembly 70 and includes the same keyhole and slide bearing features. However, the assembly 71 is attached directly to the cross bracket 85 thereby eliminating both the need for a connecting rod linkage and the associated tolerance stackup. Thus, the lock-plate assembly 71 and the corresponding lock-plate 128 do not include provisions for a biasing spring or a connecting rod attachment. Otherwise, in all functional respects lock-plate assembly 71 is substantially the same as assembly 70.

The cross bracket 85 is a weldment which is directly connected to the actuator 90 and therefore translates axially in concert with the actuator. The bracket includes an angle section 86 and a centrally located flange 88 extending from the upper leg of the angle. The bracket further includes a centrally located hole 87 (FIG. 6(*a*)) on the lower leg of the angle for attachment to the actuator 90 by means of a bolt 126 and also includes a hole 89 at each end of the upper leg of the angle for a attachment to a connecting rod.

Referring to FIG. 5, the connecting rods 80 have an elongated body 83 of circular cross section with formed clevis fittings 82 at each end of the body. The connecting rods serve to connect the lock-plate assemblies to the cross bracket by means of clevis pins 81 which slide through holes 89 in the cross bracket and holes 78 in the lock-plates respectively. The clevis pins are held in place by cotter pins 84.

Figure 6A:
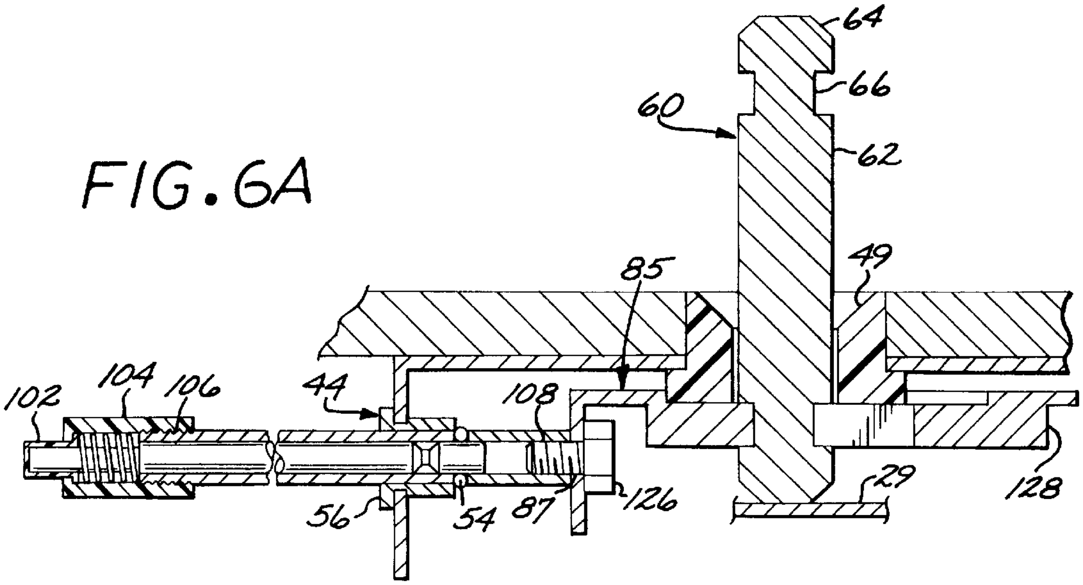
FIG. 6(*a*) is a vertical sectional view, enlarged in scale, taken along line 6(*a*)—6(*a*) as shown in FIG. 2, depicting the actuator in the coupled position.
Figure 6B:
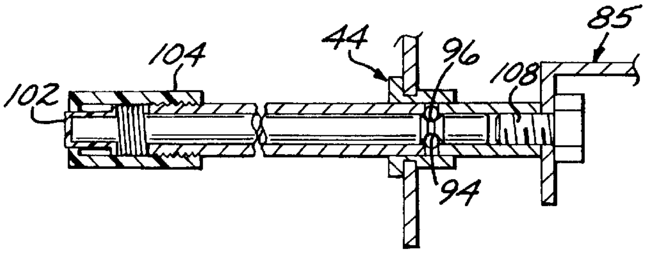
Figure 6C:
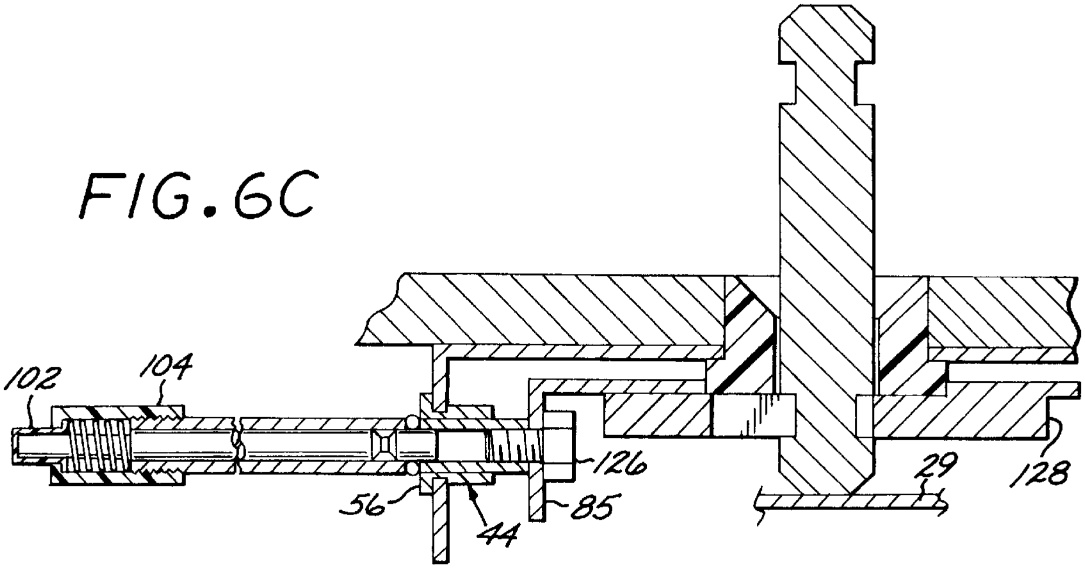
Figure 7:
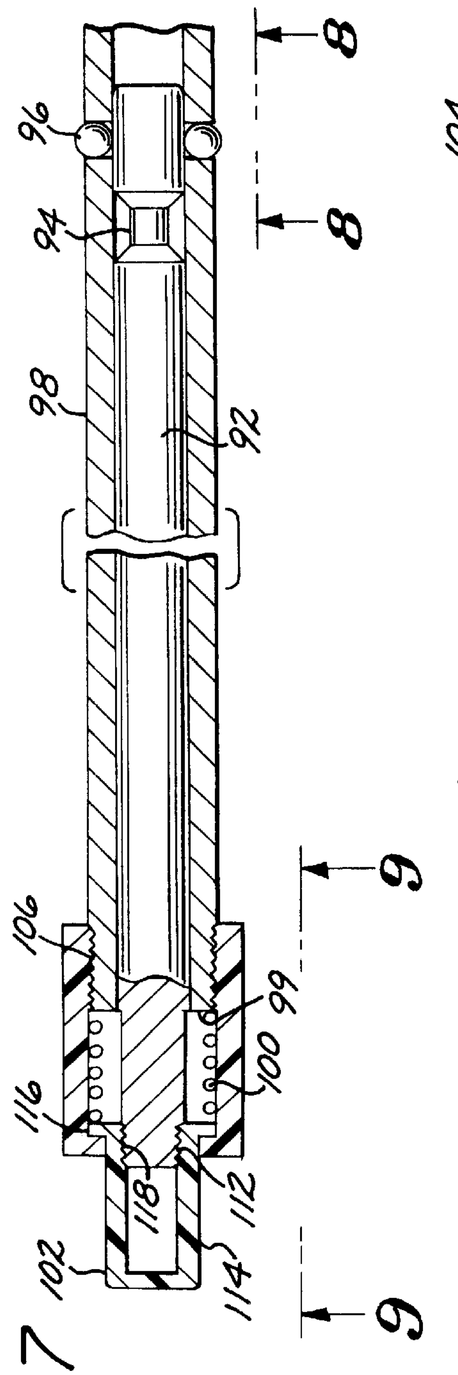
FIG. 7 is a partial sectional view, enlarged in scale, similar to FIG. 6(*a*), but depicting the actuator broken away from the surrounding structure.
Figure 8:
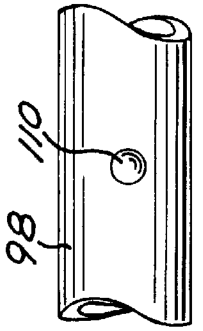
FIG. 8 is a partial bottom view of the actuator shown in FIG. 7, depicting a swaged hole in the actuator slide shaft.

The actuator 90 slidably moves the lock-plates between a normally engaged or coupling pin locked position and a disengaged or coupling pin released position. The actuator is of a ball-lock-pin type design. Referring now to FIGS. 6 and 7, the actuator contains a slide tube, generally designated 98, a ball shaft, generally designated 92, a plurality of locking balls 96, an actuator handle, generally designated 104, a push button, generally designated 102, and a biasing spring 100. The slide tube 98 is an elongated hollow shaft of circular cross section possessing a proximal end and a distal end. The proximal end of the slide tube includes an external thread 106 for attachment to the actuator handle 104 and an annular face 99 which abuts the spring 100 when assembled. The distal end includes an internal thread 108 for attachment to the cross bracket 85 by means of a hex head bolt 126. The distal end of the slide tube includes a plurality of holes 110 (FIG. 8) of diameter slightly smaller than that of the locking balls. The locking balls 96 are subsequently swaged through the holes in the slide shaft. The resulting deformed holes 110 (FIG. 8) are such that the locking balls when pushed from the inside of the shaft may extend partially outward from the holes but may not escape from the shaft.

Configured within the slide tube and disposed telescopically in a slip fit relationship with the slide tube is the ball shaft 92. The ball shaft is an elongated solid shaft of circular cross section and like the actuator body possesses both a proximal end and a distal end. The proximal end is formed with an external thread 112 for connection with the push button 102. The distal end possess an annular groove 94 for receipt of the locking balls 96.

Push-button 102 is generally of cylindrical configuration possessing a push-button barrel 114 which protrudes from the actuator handle 104 and possesses a spring stop 116. The spring stop also includes an internal thread 118 which mates with the ball shaft external thread 112.

Figure 9:
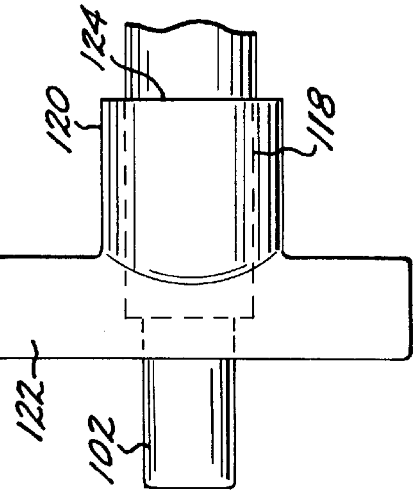
FIG. 9 is a top plan view, enlarged in scale, of the actuator handle shown in FIG. 7.
Figure 10:
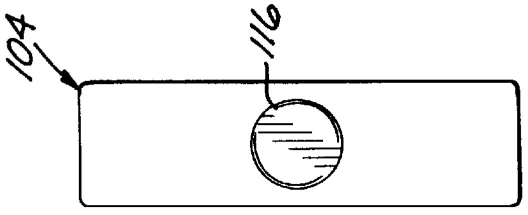
FIG. 10 is left side view, enlarged in scale, of the actuator handle shown in FIG. 7.

Referring to FIGS. 7 and 9, the actuator handle 104 is of T-shaped configuration. The T includes two bisecting rectangular sections 120 and 122. The handle is formed with an internal cylindrical cavity 124 which has an axis parallel to the axis of the ball shaft 92. The cylindrical cavity has at its distal end an internal thread 118 which mates with the external thread 106 of the slide tube. At the cavity's proximal end there is a circular bore 116 (FIG. 10) designed to accept in slip fit relationship the push button barrel 114 as shown in FIG. 7. The actuator is assembled as follows. The push-button 102 is placed inside the handle cavity 124 such that the push button barrel 114 slides into the handle bore 116. A spring 100 is placed within the handle's cylindrical cavity 124 with one end abutting the push button spring stop 116. Subsequently, the ball shaft's proximal end is threaded into the push button spring stop. The locking balls 96 are then placed into the annular groove 94 in the ball shaft 92 and the slide tube 98 is then slipped over the ball shaft. Subsequently, the slide tube's proximal end is threaded into the actuator handle 104. When thus assembled, the spring 100 will abut both the spring stop 116 and the annular face 99 at the proximal end of the slide tube. Further, the actuator is designed such that when assembled, the spring 100 will bias the push button 102 to extend out of the actuator handle. Since the ball shaft 92 is fixed to the push button 102 this establishes a baseline position for the ball shaft in relation to the slide tube. The actuator is designed such that in this baseline position the locking balls will have ridden up out of the annular groove in the ball shaft and will protrude from holes 110 in the slide tube. When the push button is depressed the annular groove in the ball shaft will slide under the holes in the slide tube and consequently the locking balls will fall into the groove. The actuator is integrated with speaker cabinet assembly 10 (FIG. 1) by sliding the actuator's distal end through the support bushings 43 and 44 (FIG. 5) which are located in each frame assembly and then connecting the distal end of the slide tube 98 to the cross bracket 85 by means of the bolt 126. The actuator is configured within a frame such that is has two static operational positions corresponding to a lock-plate engaged or locked position and a lock-plate disengaged or released position. These positions are defined by abutment faces on the support bushing 44. There is also an intermediate traverse position which corresponds to the actuator travel between the abutment faces. Referring to FIG. 6(*a*), the support bushing 44 possesses a locked position abutment face 54 and a released position abutment face 56. The actuator is designed such that the locking balls abut the locked position abutment face 54 when the lock-plate minor diameters 74 are in vertical alignment with the support collar bores 51. The actuator is further designed such that when the lock-plate major diameters 73 are in vertical alignment with the support collar bores 51, the actuator locking balls 96 abut the released position abutment face 56.

Referring to FIGS. 6(*a*) and 7, in operation the actuator may be pushed to the maximum inward extent of its travel to be positioned in the closed or pin locked position. The ball shaft 92 is in its baseline or at rest position with the locking balls 96 protruding from the slide tube 98 and abutting the support bushing 44 on its locked position abutment face 54, thereby preventing rearward travel of the actuator. In this position the actuator by means of its fixed connection to the cross bracket 85 has pushed the lock-plate 128 and by means of the connecting rods 80, the lock-plates 72 into their engaged position. In this position the minor diameter 74 of the keyhole pattern in the lock-plates is in vertical alignment with the support collar 45. If a coupling pin 60 has been inserted into the support collar, it will be resting on the pin support surface 29 and the lock-plate minor diameter 74 (FIG. 2) will have engaged the pin annular groove 66, thereby locking the pin in place. The biasing springs 76 (FIG. 2), in the lock plate assemblies 70, act to ensure that the lock-plates 72 have fully engaged the coupling pins.

Referring to FIGS. 6(*b*) and 7, the actuator push button 102 may be depressed to cause the ball shaft 92 to move forward such that the annular groove 94 will register with the locking balls 96, to receive the balls radially inwardly in the groove thus releasing the actuator. The actuator may be pulled axially outwardly allowing it to traverse the width of support bushing 44.

Referring to FIGS. 6(*c*) and 7, the actuator may be pulled axially outwardly to its fullest extent to clear the holes 110 in the slide tube, from the support bushing 44. The push button 102 may be then released to allow the ball shaft to be driven forwardly by the biasing spring 100. As the ball shaft is driven forwardly, the locking balls 96 will be driven radially outwardly in the annular groove 94. As the annular groove 94 is driven beyond the holes 110, the shaft will serve to hold the locking balls 96 protruding radially outwardly from the holes 110 in the slide tube 98 to abut the disengaged position abutment face 56 of the support bushing 44, thereby preventing forward movement of the actuator. When the locking balls abut face 56 of the support bushing 44, the keyhole pattern in the lock-plates is aligned such that major diameter 73 (FIG. 2) is centered under the support collar 45. In this lock-plate released position, coupling pins may be freely inserted through the support collars 45 such that they rest against the pin stop surface 29. Coupling pins may also be freely removed when the actuator and consequently the lock-plates are in the released position.

Referring to FIG. 6(*a*), the coupling pins 60 that interconnect the modular speaker cabinets by means of the lock-plate assemblies include an elongated body of circular cross section 62 and are made of steel. The end of each pin includes a radial chamfer 64 which serves to guide the pins into the support collars 45. The salient feature of each pin is the annular groove 66 located at each end. The groove interfaces with the minor diameter of the keyhole pattern in the lock-plates 72 and 128, with the pin being locked in place when the minor diameter engages the groove.

Figure 11:
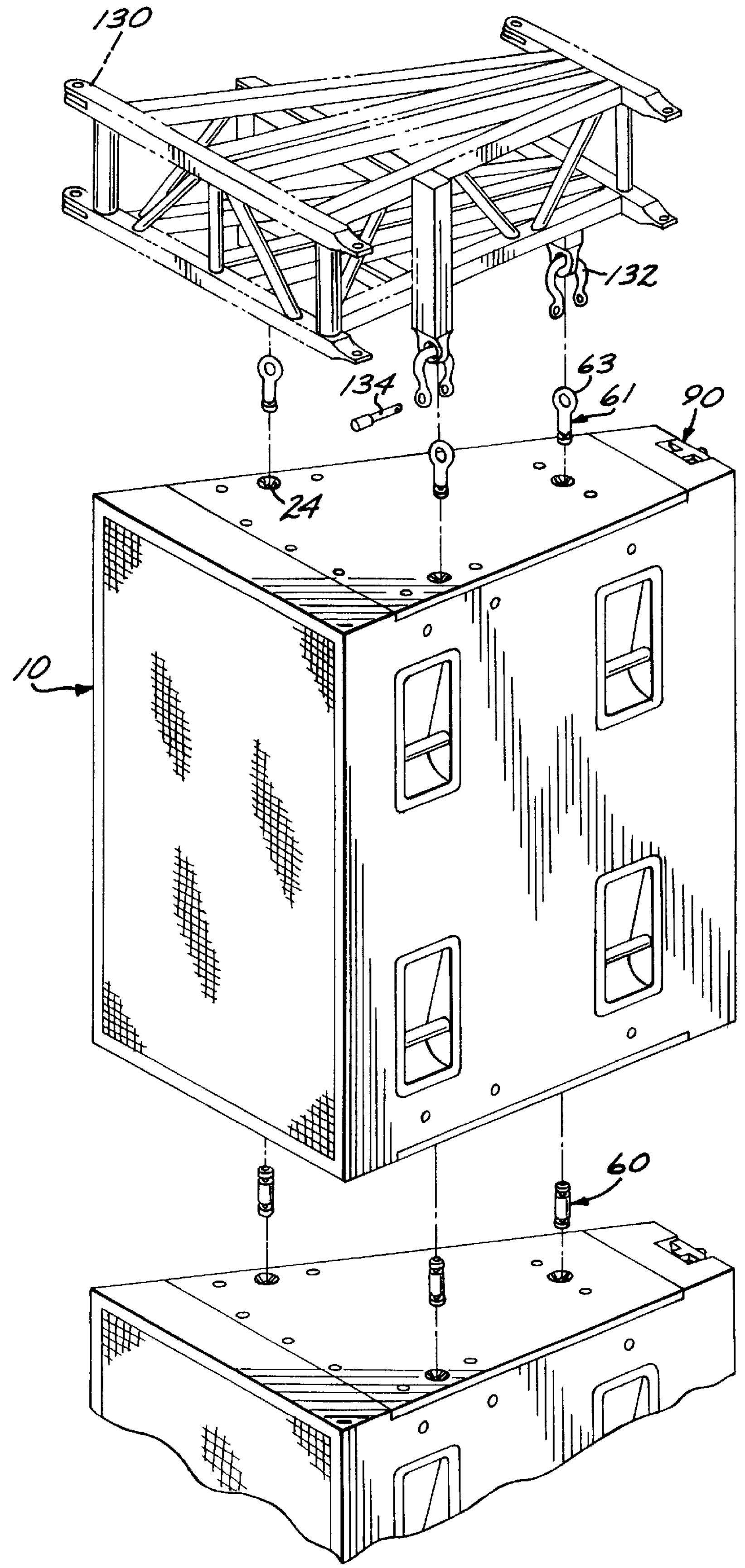
FIG. 11 is a perspective view of the speaker cabinet shown in FIG. 1, reduced in scale, shown in position for stacking with cabinets of substantially similar design.

Referring now to FIG. 11, a variation of the coupling pin, generally designated 61, is used for attaching the top most speaker to the fly-bar 130 or other suspension apparatus. These pins are substantially similar in all respects to coupling pins 60 with the exception that one end is formed as a clevis fitting 63. This clevis end 63 is attached to the fly-bar or other suspension apparatus by means of a shackle 132 and an eye bolt 134.

To create a suspended vertical column of speakers, the rigging system of the present invention operates as follows. A rigging team may place a speaker cabinet assembly 10 in a location where a vertical column is desired to be created.

A team member may then proceed to grasp the T-handle 104 of the actuator 90 and depress the push button 102 thereby causing the ball shaft 92 to be driven forwardly such that the annular groove 94 registers with the locking balls causing the locking balls to be received into the groove thus releasing the locking balls from the support bushing 44 locked position abutment face 54. The operator may then pull the handle axially outwardly from the back of the speaker cabinet until it stops. When the operator releases the push button the ball shaft 92 will be driven backwardly thereby causing the locking balls 96 to protrude radially outwardly from the holes 110 in the slide tube and abut the support bushing 44 released position abutment face 56, whereby the actuator and the lock-plates 72 and 128 are held in the released position. The force required to operate the actuator is low enough to allow for practical one handed operation.

Since the first speaker in the vertical column will be connected to the fly-bar 130, the operator will use the coupling pins 61 expressly designed for this purpose. The pins are inserted by hand in the support collars 45 of the top panel. The pins will rest against the pin stop surface 29 and thereby be held in proper vertical relation to be engaged by the minor diameter 74 of lock-plates 72 and 128. The operator may once again depresses the push button 102 to release the locking balls, and push the actuator handle 104 axially inwardly until it stops. Upon releasing the push button the ball shaft 92 will again be driven backwardly thereby causing the locking balls 96 to protrude radially outwardly from the holes 110 in the slide tube and abut the support bushing 44 locked position abutment face 54, whereby the actuator and the lock-plates will be secured in the pin-locked position.

At this time, the first speaker in the stack is connected to the fly-bar 130 by means of the shackles 132 and eye bolts 134. In addition, the lower actuator of the first speaker may be placed in the released position. By means of a motor driven winch or other hoisting apparatus the fly-bar may be raised and a second speaker positioned under the first speaker. The upper actuator of the second speaker may be placed in the released position and coupling pins 60 are inserted by hand in the support collars 45. The upper actuator may then be placed in the locked position, securing the pins. Subsequently, the lower actuator of the lowermost speaker may be placed in the released position. By means of the hoisting apparatus the first speaker is lowered such that the coupling pins extending from the top panel of the second speaker slide into the support collars in the bottom panel of the first speaker. The lower actuator of the first speaker is then placed in the locked position, thereby rigidly coupling the first and second speakers.

Once again the fly-bar is raised lifting the now coupled first and second speakers. A third speaker is then positioned under the second speaker. The upper actuator of the third speaker is placed in the released position. Coupling pins are inserted in the support collars and are locked in place by placing the actuator in the locked position. The vertical stack now consisting of two speakers is lowered such that the coupling pins extending from the top of the third speaker slide into the support collars in the bottom of the second speaker. The actuator in the bottom of the second speaker is placed in the locked position thereby rigidly coupling the third speaker to the stack. The fly-bar is again raised now lifting a stack of three speakers and a fourth speaker is placed in position below the third speaker. This process of coupling speakers is repeated until a suspended vertical column containing the desired number of speakers is created.

In a suspended vertical array created using the modular speaker of the present invention each speaker must support the weight of all speakers below it in the stack. Load produced from a suspended column of speakers is transferred in the form of axial tension through the upper set of coupling pins 60 into the upper frame 28 which beams the load in the form of shear and bending moment into the tie rods 48 which then transfer the load as axial tension into the lower frame 26 which beams the load into the lower set of coupling pins 60. In this manner, the weight of a suspended column of speakers is transferred through the internal load bearing structure of each modular speaker, thereby eliminating the need for any external load carrying structure such as the chains or cables used in the prior art.

It will be appreciated by those skilled in the art that the rigging system of the present invention provides a structurally efficient, cost effective, modular speaker, that can be quickly suspended in a vertical array without the need for external rigging hardware. It will be further appreciated that due to the rigidity of the "sound column" created by the rigging system of the present invention the vertical arrays may be spaced in close horizontal relationship and due to short length of the coupling pins the speakers in each column may be spaced in close vertical relationship thereby achieving the increased acoustical efficiency that occurs with close spacing. While only the present preferred embodiment has been described in detail, as will be apparent to those skilled in the art, certain changes and modifications can be made without departing from the scope of the invention as described in the following claims.

What is claimed is:

1. A rigging system for attaching the confronting top and bottom sides of juxtaposed speakers together comprising:

a set of coupling pins mounted in one of said sides projecting therefrom and formed with respective latch grooves;

at least one lock-plate carried slidably and shiftable between a locked position engageable with said grooves and a release position disengaged from said grooves;

at least one support bushing disposed in a spaced relationship with said lock-plate;

an elongated slide tube including a handle on one end and having its opposite extremity projecting through said support bushing, coupled to said lock-plate, and shiftable in said support bushing to shift said lock plate between said locked and unlocked positions;

a ball lock mechanism disposed in said slide tube and including locking balls selectively engageable with said support bushing to lock said slide tube in position with said lock-plate in said engaged position; and a release device in said slide tube, said release having an actuating button projecting from said handle, engaging said ball lock mechanism and being operable upon depression of said button to release said balls from said engagement with said support bushing freeing said slide tube to shift said lock-plate from said locked position.

2. A rigging system as set forth in claim 1 wherein:

said coupling pins are formed with annular grooves defining said latch grooves.

3. A rigging system as set forth in claim 1 wherein:

said support bushing is formed with respective engagement and release abutments;

said slide tube and ball lock mechanism are constructed such that, when said tube is in position with said lock-plate engaging said groove, said locking balls are engaged with said engagement abutment and, when said lock-plate is in said disengagement position, said locking balls are engaged with said disengagement abutment.

4. A rigging system as set forth in claim 1 wherein:

said lock-plate is constructed with at least one key hole having a major diameter opening for registration with said coupling pin when said plate is in said release position and a minor diameter opening for registration with said coupling pin annular groove when said plate is in said locked position.

5. A rigging system as set forth in claim 1 wherein:

said ball lock mechanism includes a slide tube possessing a proximal and a distal end, said proximal end connecting with said handle, said distal end including a plurality of outwardly opening holes, said holes formed such that said locking balls may extend partially outward from said holes while being held captive in said holes;

a ball shaft received telescopically within said slide tube, said ball shaft having a proximal end and a distal end, wherein said proximal end possesses an attachment for connecting with said operating handle, and wherein said distal end contains an annular groove, for the receipt of said balls;

a biasing spring disposed inside said handle in such manner as to bias said ball shaft in such position that said balls normally protrude from said slide tube.

6. An array of modular speaker cabinets to be coupled together in vertical spaced relationship comprising:

a plurality of modular speakers including upper and lower frames formed with respective longitudinal slide tracks;

said upper and lower frames are connected in vertical spaced relationship by a plurality of vertical members;

upper and lower respective lock-plates received in said slide tracks along respective slide paths for sliding between respective locked and respective released positions, including respective latching edges;

an upper and a lower actuator carried respectively in said upper and lower frames where said actuators are connected to said upper and lower lock-plates respectively and are capable of selectively shifting said lock-plates between said released and said locked positions;

respective upper and lower panels mounted on said respective upper and lower frames and including respective pin receiving openings aligned vertically over the respective slide paths through which the respective latch edges travel;

pin stop surfaces formed on the respective bottom surfaces of said frames in vertical alignment with the respective said openings;

elongated coupling pins receivable in said respective openings and formed on their respective extremities with upper and lower latching grooves to be engaged by the respective said latching edges, said pin grooves being so configured that when the bottom extremities of said pin are inserted in the respective said upper openings and abutted against the respective pin stop surfaces, said lower latching grooves will be disposed in the respective said slide paths for engagement of said latch edges when the upper of said plates is shifted into the respective said locked position and the respective said upper extremities of said pins project above the respective said top panels for selective receipt in the respective said bottom openings of the respective said mating speakers.

7. The array of modular speaker cabinets to be coupled together in vertical spaced relationship of claim 6 wherein:

said lower panels are configured to be supported in spaced relationship on the respective top panels; and the respective said coupling pins are configured such that when their bottom extremities are inserted in the respective said upper openings of a bottom speaker engaged with said pin stop surfaces thereof, the respective upper extremities thereof are projected upwardly from the respective said upper panels a sufficient distance such that when a respective bottom panel of a speaker is positioned on such top panel, the upper latching grooves of the respective pins will be positioned in alignment with the respective said slide paths of the respective slide plate latching edges.

8. The array of modular speaker cabinets to be coupled together in vertical spaced relationship of claim 6 wherein:

said actuator is a ball lock pin type device.

9. The array of modular speaker cabinets to be coupled together in vertical spaced relationship of claim 6 wherein:

said vertical members are tie rods which include external threads on each end.

10. A method for rigging a vertical array of modular speakers comprising the steps of:

selecting a plurality of speakers, each including a housing and load carrying upper and lower frames with vertical pin receiving bores arranged in a predetermined pattern aligned with respective upper and lower sliding lock-plates formed with respective keyway shaped openings;

selecting a plurality of load carrying vertical tie rods which are removably connected to said upper and lower frames in vertical spaced relationship;

selecting elongated coupling pins receivable in the respective said bores and formed on their respective extremities with upper and lower latching grooves to be engaged by the respective said sliding lock-plate defining said keyway openings; and erecting a series of said speakers in a vertical stack by sequentially selecting lower and upper speakers to be stacked one above the other, inserting respective bottom extremities of selected coupling pins through respective bores in the upper frame of said selected lower speaker into respective locking positions to engage the respective said lower latching grooves of said selected pins to lock the said selected coupling pins in place, positioning said upper speaker over said selected lower speaker to align the respective bores in the lower frame thereof with said selected coupling pins and lowering said upper speaker to receive the upper extremity of said selected coupling pins in the said bores of said lower frame to align said upper grooves with the locking plates of said lower frame and sliding said locking plates of said lower frame into a locking position to engage said upper grooves to couple said upper cabinet to said lower cabinet.

11. The method of claim 10 that includes:

after sliding said locking plates into said locking positions, latching them into position.

12. The method of claim 10 that includes:

after shifting said selected lower latching plates into position, raising said selected upper speaker to raise said selected lower speaker.

13. The method of claim 10 that includes:

selecting a plurality of load carrying vertical tie rods and fastening said rods between said upper and lower frames.

* * * * *